United States Patent [19]

Tanaka

[11] 4,401,951
[45] Aug. 30, 1983

[54] BIAS CIRCUIT FOR USE IN A SINGLE-ENDED PUSH-PULL CIRCUIT

[75] Inventor: Susumu Tanaka, Tokyo, Japan

[73] Assignee: Sansui Electric Co., Ltd., Tokyo, Japan

[21] Appl. No.: 191,405

[22] Filed: Sep. 29, 1980

[30] Foreign Application Priority Data

Oct. 2, 1979 [JP] Japan ............................ 54-136386[U]

[51] Int. Cl.$^3$ .............................................. H03F 3/30
[52] U.S. Cl. .................................................... 330/268
[58] Field of Search ................ 330/268, 267, 273, 274

[56] References Cited

U.S. PATENT DOCUMENTS

| | | | |
|---|---|---|---|
| 3,995,228 | 11/1976 | Pass | 330/268 X |
| 4,254,379 | 3/1981 | Kawanabe | 330/268 |
| 4,274,059 | 6/1981 | Okabe | 330/268 X |

Primary Examiner—James B. Mullins
Attorney, Agent, or Firm—Harris, Kern, Wallen & Tinsley

[57] ABSTRACT

A bias circuit for use in the single-ended push-pull circuit has NPN and PNP transistors whose emitters are connected to each other and whose collectors provide a bias voltage, diodes and resistance elements. On the operating side, the diode gives a reference voltage and the resistance element detects the voltage corresponding to the increase of the output voltage exceeding the reference voltage. Simultaneously, on the unoperating side, the diode decreases the voltage between its both terminals. Thus the bias voltage is made larger, by positive feedback operation on the operating side and by negative feedback operation on the unoperating side, enough to prevent output power transistor on the unoperating side from being cut off.

8 Claims, 12 Drawing Figures

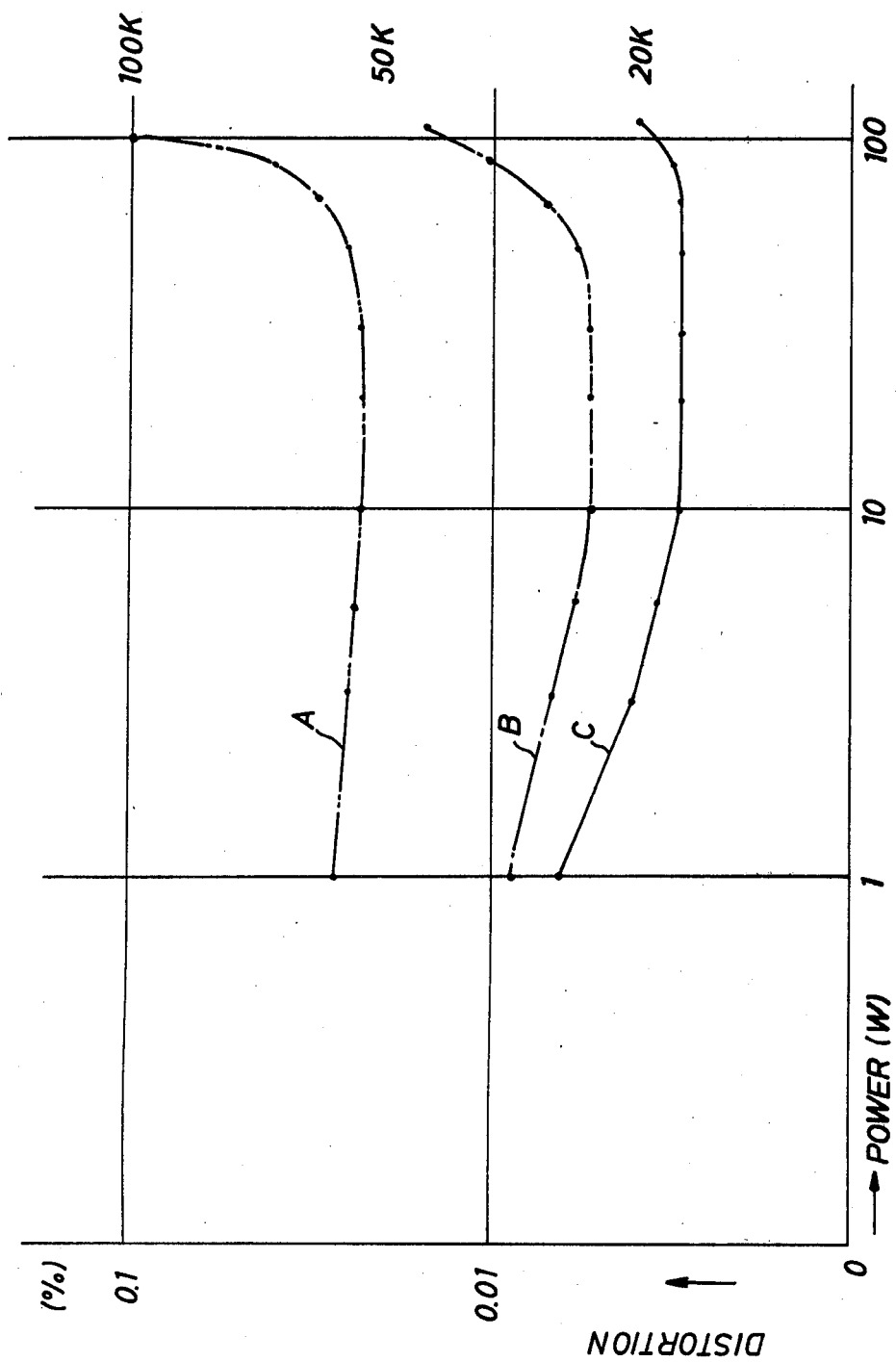

F I G. 11
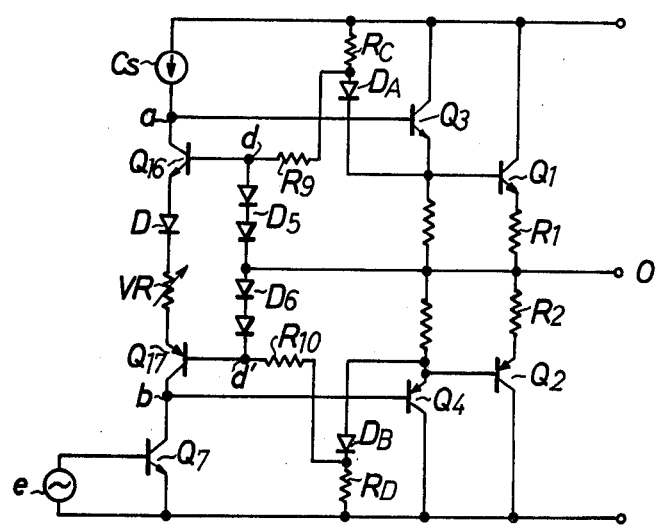

BIAS CIRCUIT FOR USE IN A SINGLE-ENDED PUSH-PULL CIRCUIT

BACKGROUND OF THE INVENTION

1. Field of the Invention

The present invention relates to a bias circuit of a single-ended push-pull circuit, and more particularly to a bias circuit capable of eliminating the switching and cross-over distortions of power transistors in Class B operation.

2. Prior Art

Though Class B amplifiers have higher efficiency than that of Class A amplifiers, the former were disadvantageous in that the so-called switching distortion is caused following a switching operation of bipolar transistors because the bipolar transistors are cut off in their non-operation state.

Referring to FIG. 1, the switching distortion will be now described in the case where the conventional single-ended push-pull circuit is operated in Class B mode. The single-ended push-pull circuit comprises a complementary circuit of NPN and PNP transistors, in which plural power transistors (three in FIG. 1) are connected with each other in Darlington manner. Connected in series between the bases of first stage NPN and PNP transistors $Q_5$ and $Q_6$ are a diode D for thermal compensation and a variable resistance VR for voltage adjustment, and supplied to this in-series circuit is current from a constant current circuit CS to form a bias circuit for the single-ended push-pull circuit. For the purpose of suppressing minimum the switching distortion even when such single-ended push-pull circuit is operated in Class B mode, the voltage between the bases of transistors $Q_5$ and $Q_6$ is determined to become similar to Class AB operation by adjusting the variable resistance VR in such a way that small current is caused to flow through output stage power transistors $Q_1$ and $Q_2$ when no input signal is present, that is, when the state is quiescent.

In this single-ended push-pull circuit of Class B mode, potential difference is almost not caused across an emitter resistance $R_1$ or $R_2$ since current flowing through the resistance $R_1$ or $R_2$ of output stage power transistor $Q_1$ or $Q_2$ is small in the quiescent state. However, potential difference is caused across the emitter resistance $R_1$ or $R_2$ since large current flows through the resistance $R_1$ or $R_2$ at the time of signals being applied as inputs. For example, providing that the NPN transistor $Q_1$ is operated and that an output signal current $I_O$ is flowing through the resistance $R_1$, a potential difference of $I_O R_1$ is caused. In addition, large current flows even through the power transistor $Q_1$ to increase the voltage $V_{BE}$ between its base and emitter. Thus, the potential difference between the base of first stage NPN transistor $Q_5$ and an output point (or between a and O) is increased. On the other hand, since the potential difference between the bases of first stage NPN and PNP transistors $Q_5$ and $Q_6$ (or between a and b) is determined to a certain value by the bias circuit, the bias voltage between the base of first stage PNP transistor $Q_6$ and the output point (or between b and O) becomes insufficient and the potential difference therebetween becomes zero or reversed causing the PNP transistor $Q_2$ to be cut off. As the result, the base carrier of bipolar PNP transistor $Q_2$ is ejected, but this ejection of base carrier is not performed instantly but with a time delay, thus causing distortion in the wave form of output signals. Even in the case where input signals to the push-pull circuit are reversed and the bipolar PNP transistors $Q_2$ is returned to operation, the injection of base carrier is also performed with a time delay causing distortion in the wave form of output signals. In short, it is impossible to avoid the occurrence of switching distortion as long as the biased state is caused under which PNP transistors $Q_2$, $Q_4$ and $Q_6$ are cut off. Similarly, the switching distortion also arises in the case where NPN transistors $Q_1$, $Q_3$ and $Q_5$ are cut off.

It is therefore conceived to prevent the occurrence of such switching distortion that current flowing through the output stage of push-pull circuit is detected to control the voltage between the bases of input stage transistors and to compensate for the shortage of bias voltage at the time of signals being applied as inputs, preventing the output transistors from being cut off.

Basing on this concept, a bias circuit shown in FIG. 2 was proposed. Also in this circuit the variable resistance VR is adjusted to cause bias current to flow through output stage transistors $Q_1$ and $Q_2$ in the quiescent state. When an input signal e is impressed through the transistor $Q_7$ and the NPN transistor $Q_1$ is operated, for example, a potential difference arises across the resistance $R_1$, and $V_{BE}$ of power transistor $Q_1$ also increases. The potential difference between a and O increases by a value corresponding to the increase of potential difference between both terminals of resistance $R_1$ and that of $V_{BE}$. Therefore, the potential difference between the base of transistor $Q_{10}$ and the point a increases by a value corresponding to the sum of these increases, so that current flows through the resistance $R_3$ and a potential difference corresponding to this sum of increases appears in the resistance $R_3$. The voltage between emitter and collector of transistor $Q_8$ therefore increases by a value corresponding to the potential difference between both terminals of resistance $R_3$ and the potentail difference between a and b increases by a value corresponding to the increase of this voltage. Accordingly, the PNP transistor $Q_2$ is biased to allow bias current to flow therethrough even at the time of signals being applied as inputs as well as at the time of no signal present. When the input signal is reversed and the PNP transistor $Q_2$ is operated, a potential difference appears between both ends of resistance $R_4$ corresponding to the increase of potential difference in the resistance $R_2$ and that of $V_{BE}$ of power transistor $Q_2$, and the voltage between emitter and collector of transistor $Q_9$ increases by a value corresponding to the sum of these increases, so that the bias voltage between a and b increases and bias current is caused to flow through the NPN transistor $Q_1$ similarly as at the time of no signal present. Therefore, power transistors $Q_1$ and $Q_2$ are not held cut off to thereby prevent the switching distortion from being occurred.

However, the circuit shown in FIG. 2 employs constant voltage sources $E_1$ and $E_2$. Therefore, the circuit practically used becomes complicated and is intended only to attain positive feedback operation in which the increase of potential difference of operating output stage transistors is detected to increase the voltage of bias circuit. When the bias voltage of unoperating transistors decreases, no change in voltage appears in the collector of the transistor $Q_8$ and the voltage of bias circuit cannot be increased because constant voltage sources $E_1$ and $E_2$ are used to form reference voltages and their internal resistances do not change. Namely, since negative feedback operation is not attained by the circuit, it may happen that the unoperating transistor $Q_2$ is cut off when the bias voltage of unoperating transistors decreases, thus making it impossible to completely remove the switching distortion.

Further, in the circuit shown in FIG. 2, the emitters of transistors $Q_{10}$ and $Q_{11}$ are respectively connected through resistances $R_3$ and $R_4$ to the bases of first stage transistors $Q_5$ and $Q_6$ of push-pull circuit. This means that transistors $Q_{10}$ and $Q_{11}$ serve as loads for the previous voltage amplification stage. Generally, the emitter of transistor has low impedance and non-linearity characteristic, and the output impedance of voltage amplification stage is the highest in the amplifying device. Since the emitter of transistor $Q_{10}$ having low impedance is connected to the voltage amplification stage of high impedance in the circuit shown in FIG. 2, these matters that the load of voltage amplification stage becomes low and that the emitter of transistor $Q_{10}$ has non-linearity characteristic contribute therefore to the occurrence of distortion.

Furthermore, since transistors $Q_8$ and $Q_{10}$ and transistors $Q_9$ and $Q_{11}$ are connected with each other in inverted Darlington manner in the circuit shown in FIG. 2, the paired may be regarded as an NPN transistor and a PNP transistor, respectively, where the emitters of equivalent NPN and PNP transistors are arranged to connect to points a and b, respectively. Even if basing on this concept, the circuit shown in FIG. 2 causes distortion because a low load of non-linearity is connected to the voltage amplification stage.

Japanese Patent Pre-Publication No. 54-77054 discloses a circuit shown in FIG. 3. The emitters of controlling transistors $Q_{12}$ and $Q_{13}$ are also connected to the points a and b, respectively, in this circuit, thus making it impossible to avoid the occurrence of distortion due to the fact that the load of voltage amplification stage becomes low similarly as in the conventional circuit shown in FIG. 2. In addition, the potential difference appearing in the both terminals of emitter resistance $R_1$ or $R_2$ of output stage transistor $Q_1$ or $Q_2$ is applied as input to between the base and emitter of controlling transistor $Q_{12}$ or $Q_{13}$ in the circuit shown in FIG. 3, so that the potential difference is amplified to greatly increase the bias voltage between a and b. The increase of bias voltage between a and b does not correspond in relation of 1 to 1 to that of potential difference between a and O or b and O, thus making it impossible to attain accurate bias control.

A circuit shown in FIG. 4 was disclosed in U.S. Pat. No. 3,995,228, in which operation is attained in such a way that output transistors $Q_1$ and $Q_2$ are not cut off by connecting two $V_{BE}$ Multipliers in series and letting the constant voltage source $E_3$ or $E_4$ and the diode $D_3$ or $D_4$ form a reference voltage. However, voltage sources $E_3$, $E_4$ of low impedance and diodes $D_3$, $D_4$ of non-linearity are connected through resistances $R_6$ and $R_7$ to the points a and b of final voltage amplification stage of circuit which is operated in high impedance. As the result, a load of low impedance and non-linearity is connected to the voltage amplification stage, to thereby cause distortion similarly as in the circuits shown in FIGS. 2 and 3. In addition, since constant voltage sources $E_3$ and $E_4$ are used in the circuit, negative feedback is not attained to increase the bias voltage between a and b when the transistors $Q_1$ and $Q_2$ are about to be cut off.

OBJECTS AND SUMMARY OF THE INVENTION

The present invention is therefore intended to eliminate the above-mentioned drawbacks and to provide a bias circuit in the single-ended push-pull circuit, free from distortions such as switching one in output signals and simple in construction.

The present invention is also intended to provide a bias circuit for use in the single-ended push-pull circuit which includes NPN transistors connected to plural stages in Darlington manner and PNP transistors similarly connected in Darlington manner, comprising a first bias transistor, of NPN type having a collector connected to the base of a first stage NPN transistor, a second bias transistor of PNP type having an emitter connected to the emitter of first transistor as well as a collector connected to the base of a first stage PNP transistor, a first resistance element connecting the base of first transistor with the emitter of one of NPN transistors except those on the output stage of push-pull circuit, and a second resistance element connecting between the base of second transistor and the emitter of one of PNP transistors except those on the output stage of push-pull circuit, wherein positive feedback operation can be achieved in such a way that a potential difference corresponding to a large one appearing on the output stage resistance elements is detected by these first and second resistances to increase the bias voltage between the collectors of first and second transistors. Since first and second resistance elements are not connected to the collectors of first and second transistors, only the collectors of first NPN and PNP transistors and of high impedance are connected to previous voltage amplification stage.

The bias circuit according to the present invention, further comprises a first diode connected to between the base of first NPN transistor and the output point of push-pull circuit and a second diode connected to between the base of second PNP transistor and the output stage of push-pull circuit. These first and second diodes serve to give a reference voltage in positive feedback operation, while to achieve negative feedback operation, when transistors on the unoperating side are about to be cut off, in such a way that internal resistance of the first or second diode on the unoperating side becomes high to make the potential difference large between the collectors of first NPN and second PNP transistors.

As to the operating side of the push-pull circuit, when the output current increases, the potential across the first resistance increases, causing the collector potential of the first bias circuit high and, resulting in the increase of the bias voltage. As to the unoperating side of the push pull circuit, when the output transistor is about to be cut off due to the increase in the output current of the opeating side, the internal resistance of the second diode increases, causing the base potential of the second bias transistor high and resulting in the increase of the bias voltage.

BRIEF DESCRIPTION OF THE DRAWINGS

FIG. 7 is a logarithmic graph showing the distortions of output signals in the conventional circuits.

FIG. 11 is a circuit diagram showing a further embodiment according to the present invention.

DESCRIPTION OF THE PREFERRED EMBODIMENT

Figure 1:
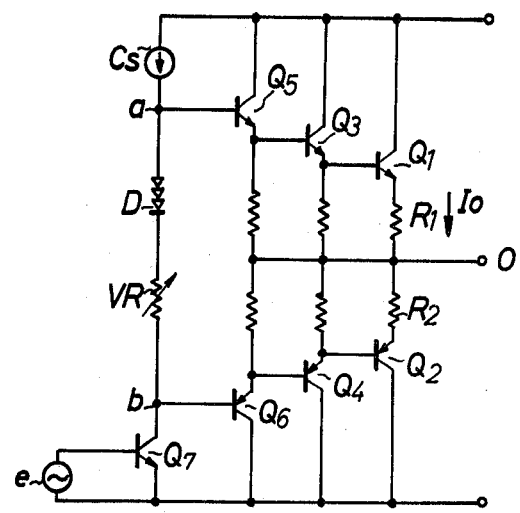
FIG. 1 is a circuit diagram showing a conventional bias circuit for use in the single-ended push-pull circuit.

The present invention will be now described with reference to the accompanying drawings, in which same parts as those in FIGS. 1 through 4 are represented by same reference numerals.

Figure 5:
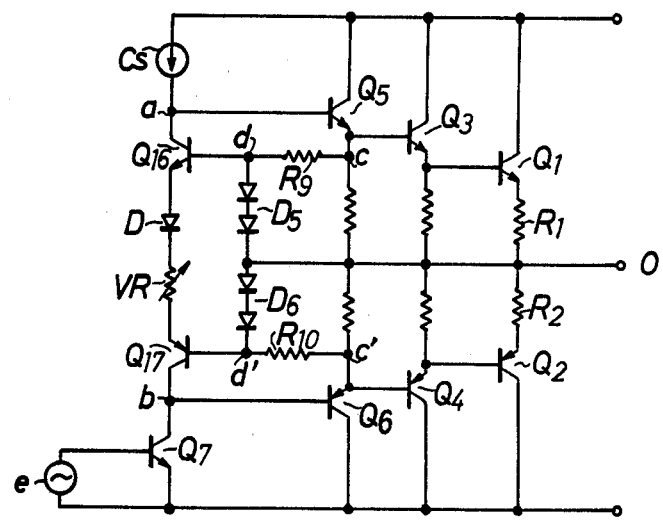
FIG. 5 is a circuit diagram showing an embodiment of a bias circuit for use in the single-ended push-pull circuit according to the present invention.

Referring to FIG. 5, three NPN transistors $Q_1$, $Q_3$, $Q_5$ and three PNP transistors $Q_2$, $Q_4$, $Q_6$ are connected with one another in Darlington manner. To form a bias circuit in the single-ended push-pull circuit of complementary symmetry, the collectors of an NPN transistor $Q_{16}$ and a PNP transistor $Q_{17}$ are connected between the bases, or a and b, of first stage transistors $Q_5$ and $Q_6$, and a diode D and a variable resistance VR are connected between the emitters of transistors $Q_{16}$ and $Q_{17}$. Constant current is supplied from a constant current source CS to the series circuit comprising the transistor $Q_{16}$, diode D, variable resistance VR and transistor $Q_{17}$. The circuit arrangement formed so far is same as the conventional one shown in FIG. 2, but in the embodiment of the present invention the bases of transistors $Q_{16}$ and $Q_{17}$ are connected via resistance $R_9$ and $R_{10}$ to the emitters of first stage transistors $Q_5$ and $Q_6$ of push-pull circuit, respectively, and via forward and backward diodes $D_5$ and $D_6$ to the output point O.

The variable resistance VR is adjusted in such a way that small bias current flows through output stage power transistors $Q_1$ and $Q_2$, and that these transistors $Q_1$ and $Q_2$ are not cut off at the time of no signal present, and the push-pull circuit of Class B operation is thus arranged to attain Class AB operation.

When an input signal is applied through the transistor $Q_7$ and the potential of point b is shifted positive, NPN transistors $Q_5$, $Q_3$, and $Q_1$ connected one another in Darlington manner are operated and large current flows through the resistance $R_1$ to increase output current. This causes a potential difference to arise at both sides of resistance $R_1$, and the voltage passing from the emitter point c of transistor $Q_5$ through the transistors $Q_3$, $Q_1$ and resistance $R_1$ to the output point O increases by a value corresponding to the sum of the increase of the potential difference and that of $V_{BE}$ of transistors $Q_1$ and $Q_3$. On the other hand, the voltage passing from the point c through the resistance $R_9$ and diode $D_5$ to the output point O also increases by a value corresponding to the sum of the increase of potential difference of resistance $R_1$ and that of $V_{BE}$. The amount of potential decrease in the diode $D_5$ which comprises two diodes connected in series, namely, the potential difference between d and O is kept constant to give a reference voltage. When the diode $D_5$ is made of silicon semiconductor, for example, the forward voltage of one diode is 0.6 V. The forward voltage of diode $D_5$ is therefore totaled 1.2 V and constant. Accordingly, current flows through the resistance $R_9$ and there appears both ends of resistance $R_9$ a potential difference corresponding to the sum of the increase of potential difference of resistance $R_1$ and that of $V_{BE}$ of transistors $Q_1$ and $Q_3$. The potential difference between the collector and emitter of transistor $Q_{16}$, or between a and d, thus increases by a value corresponding to the potential difference between both ends of resistance $R_9$. Since the base potential of transistor $Q_{16}$ is kept constant through the diode $D_5$ and the voltage between the base and emitter of transistor $Q_{16}$ is unchangeable, the voltage between the emitter and collector of transistor $Q_{16}$ increases corresponding to the potential difference between both ends of resistantce $R_9$, that is, the sum of the increase of potential difference between both ends of resistance $R_1$ and that of $VE_{BE}$ of transistors $Q_1$ and $Q_3$. Therefore, the potential difference between a and b also increases by this sum and the potential difference between b and O is same as at the time of no signal present, so that bias current continues to flow through the PNP transistor $Q_2$, preventing the transistors $Q_2$ from being cut off.

When the input signal is inverted and the PNP transistors $Q_6$, $Q_4$ and $Q_2$ and $Q_2$ are operated, there appears both ends of resistance $R_{10}$ a potential difference equal to the potential difference appearing both ends of resistance $R_2$ as stated above and to the increase of $V_{BE}$ of transistors $Q_4$ and $Q_2$, and the potential difference of diode $D_6$ which comprises two diodes connected in series is constant to give a reference voltage. The voltage between the collector and emitter of transistor $Q_{17}$ therefore increases and the voltage between a and b increases. As the result, the voltage between a and O is kept same as at the time of no signal present and bias current flows through the transistor $Q_1$, preventing the transistor $Q_1$ from being cut off.

Description will be made to the operation in the case where the transistors on the unoperating side are about to be cut off in the circuit shown in FIG. 5. When current flows through NPN transistors $Q_5$, $Q_3$, $Q_1$ and current flowing through the resistance $R_1$ increases to make higher the voltage between both ends of resistance $R_1$ at the time of input signal being applied, PNP transistors $Q_2$, $Q_4$ and $Q_6$ are about to be cut off. Current flowing through the diode $D_6$ and resistance $R_{10}$ also decreases, and the internal resistance of diode $D_6$ therefore increases as apparent from its V-I characteristic. The PNP transistor $Q_{17}$ serves to function as a low current circuit in a half cycle of its operation time, because enough current flows through the diode $D_6$ keeping the voltage of diode $D_6$ constant and the base voltage of transistor $Q_{17}$ is constant. However, in a half cycle of its non-operation time there appears in its base voltage the decrease corresponding to the bias voltage decrease of PNP transistors $Q_2$ and $Q_4$, because the internal resistance of diode $D_6$ becomes higher. Therefore, the decrease of base potential of transistor $Q_{17}$ is inverted to the collector of transistor $Q_{17}$, resulting in an elevation of collector potential. This can be differently explained that when current flowing through the diode $D_6$ and resistance $R_{10}$ decreases, the voltage between the bases of transistors $Q_{16}$ and $Q_{17}$ also decreases, so that transistors $Q_{16}$ and $Q_{17}$ are driven to the direction of their being cut off to increase the potential difference between the collectors, or a and b, of transistors $Q_{16}$ and $Q_{17}$. Accordingly, enough bias voltage is impressed to transistors $Q_2$, $Q_4$ and $Q_6$ on the unoperating side, preventing these transistors from being cut off.

When PNP transistors $Q_2$, $Q_4$ and $Q_6$ are shifted operating side, transistors $Q_1$, $Q_3$ and $Q_5$ are about to be cut off, the internal resistance of diode $D_5$ increases, an amount corresponding to the bias voltage shortage of NPN transistors $Q_1$, $Q_3$ and $Q_5$ appears in the base of NPN transistor $Q_{16}$ to enhance its collector voltage, and the potential difference between a and b increases. As the result, transistors $Q_1$, $Q_3$ and $Q_5$ are not to be cut off.

When summarizing these operations, the circuit embodiment shown in FIG. 5 is characteristic in simultaneously performing the following two operations when the output current on the operation side increases.

(1) Positive feedback operation in which the output voltage increases across the emitter resistance and that of $V_{BE}$ of output transistors on the operating side due to the increase of output current and detected to increase the voltage of bias circuit, thus preventing output transistors on the unoperating side from being cut off.

(2) Negative feedback operation in which the bias voltage decrease of output transistors on the unoperating side due to the increase of the output voltage on the operation side is detected to increase the voltage of bias circuit, thus preventing output transistors on the unoperating side from being cut off.

According to the arrangement of bias circuit as stated above, output transistors $Q_1$ and $Q_2$ are never cut off at the time of no signal present. In addition, even when signals are being applied as inputs, positive feedback operation is attained viewing output transisors on the operating side at the time of output current increase, while negative feedback operation viewing output transistors on the unoperating side when they are about to be cut off, so that output transistors $Q_1$ and $Q_2$ are not cut off to thereby prevent the occurrence of distortions.

Diodes $D_5$ and $D_6$ in this circuit embodiment serve to give a certain reference voltage at the time of output current increase in such a way that the base potentials of transistors $Q_{16}$ and $Q_{17}$ are not increased higher than the emitter potentials of transistors $Q_5$ and $Q_6$ at the time of no signal present, and when the emitter point c or c' exceeds a value of voltage corresponding to the sum of base emitters voltage $V_{BE}$ of transistors $Q_1$ and $Q_3$, or $Q_2$ and $Q_4$, the excess portion is arranged to appear in the resistance $R_9$ or $R_{10}$. In addition, when output transistors are about to be cut off, diodes $D_5$ and $D_6$ serve to cause the influence to appear in the bases of transistors $Q_{16}$ and $Q_{17}$ by increasing their internal resistances. As apparent from the above, diodes $D_5$ and $D_6$ serve to attain different functions depending on the operating and unoperating sides so as to prevent output transistors on the unoperating side from being cut off. This is a feature of this circuit embodiment and the reason why the removal of switching distortion can be made better than by the conventional circuits shown in FIGS. 2 and 4 using constant voltage source circuits $E_1$, $E_2$, $E_3$ and $E_4$.

The circuit embodiment shown in FIG. 5 can also eliminate the cross-over distortion as well as the switching distortion.

Figure 6A:
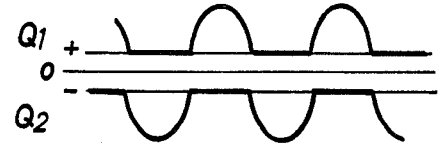
FIGS. 6A and 6B are diagrams showing the wave forms of output current in the embodiment circuit shown in FIG. 5.

Providing now that diodes shown in FIG. 5 be completely constant voltage sources such as battery, the current wave forms of output transistors $Q_1$ and $Q_2$ will be as shown in FIG. 6A. Namely, since current is held a certain value at the non-operation time of output transistors $Q_1$ and $Q_2$, the change in current is hard or rapid at the shifting time of operation. Therefore, even if the switching distortion is not caused because both of $Q_1$ and $Q_2$ are not cut off even at the time of non-operation, the cross-over distortion is caused because positive and negative currents are not smoothly continued.

Figure 6B:
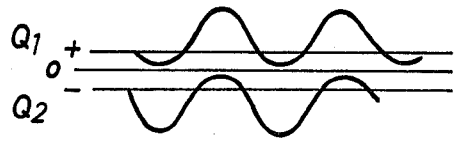

However, when diodes $D_5$ and $D_6$ are used as shown in the circuit embodiment of the present invention of FIG. 5, the current change at the non-operation time of transistors $Q_1$ and $Q_2$ represents logarithmic curves, as shown in FIG. 6B, due to the current flowing through the diodes, so that the current change at the shifting time of operation is not rapid but curved, and positive and negative currents are smoothly continued, thus preventing the occurrence of cross-over distortion. In addition, current flowing through the unoperating side becomes smaller at this time as compared with the case shown in FIG. 6A, so that power loss is kept lower and almost same as that of Class B amplifiers, notwithstanding the output transistors $Q_1$ and $Q_2$ kept not to be cut off.

Figure 2:
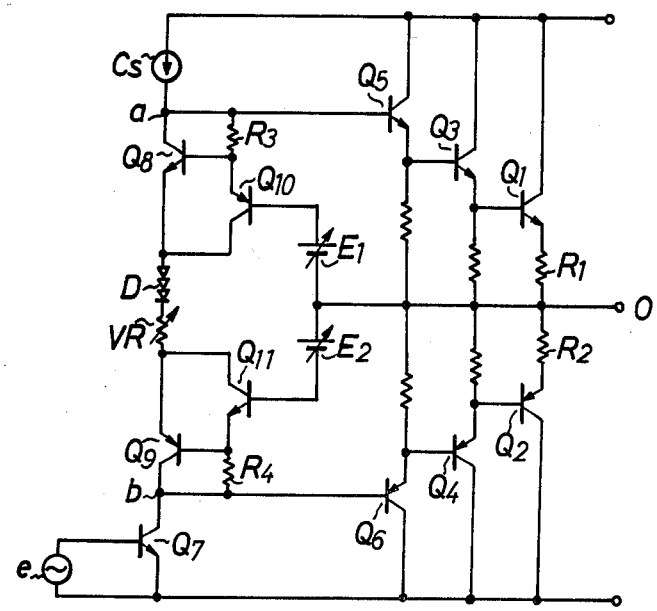
FIG. 2 is a circuit diagram showing another conventional bias circuit.
Figure 4:
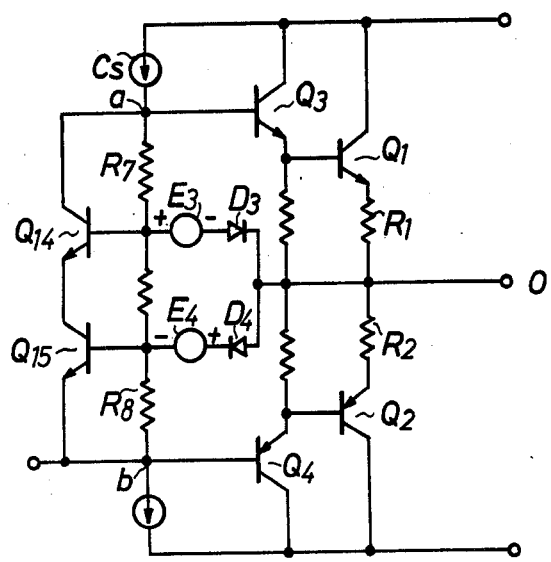
FIG. 4 is a circuit diagram showing a still further conventional bias circuit.

The reason why the cross-over distortion can be eliminated, as stated above, by the circuit embodiment shown in FIG. 5 is because of diodes $D_5$ and $D_6$ employed, but the conventional circuits using constant voltage sources as shown in FIGS. 2 and 4 are useless in eliminating the cross-over distortion as apparent from FIG. 6A.

According to the circuit embodiment shown in FIG. 5, connected to the points a and b are not the emitter sides but the collector sides of transistors $Q_{16}$ and $Q_{17}$, said collector sides being high in impedance. Therefore, it does not happen in the circuit embodiment shown in FIG. 5 that distortion is caused in output signals due to a low load being connected to the high impedance circuit of previous voltage amplification stage as shown in the conventional circuits of FIGS. 2 and 4. In the case of circuit embodiment shown in FIG. 5, resistances $R_9$ and $R_{10}$ for detecting the change in output current are not connected to the final stage of previous voltage amplification stages, but to the emitters of transistors which form the push-pull circuit, and the low load of non-linearity is not therefore connected to the high impedance voltage amplification stage, thus preventing the occurrence of distortions.

Figure 3:
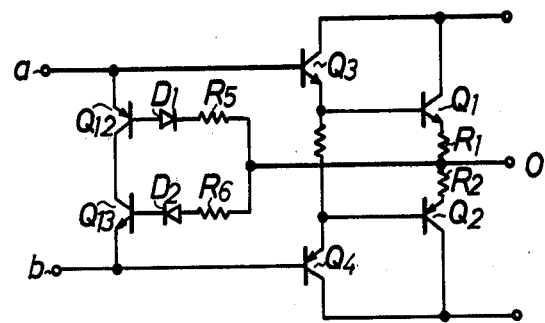
FIG. 3 is a circuit diagram showing a further conventional bias circuit.

And according to this circuit embodiment, the amount corresponding to the potential difference of resistance $R_1$ $R_2$ appears between the base and collector of transistor $Q_{16}$ or $Q_{17}$ and, different from the conventional circuit shown in FIG. 3, the voltage amplification degree is therefore made 1 accurately, thus allowing accurate bias control to be attained.

Figure 8:
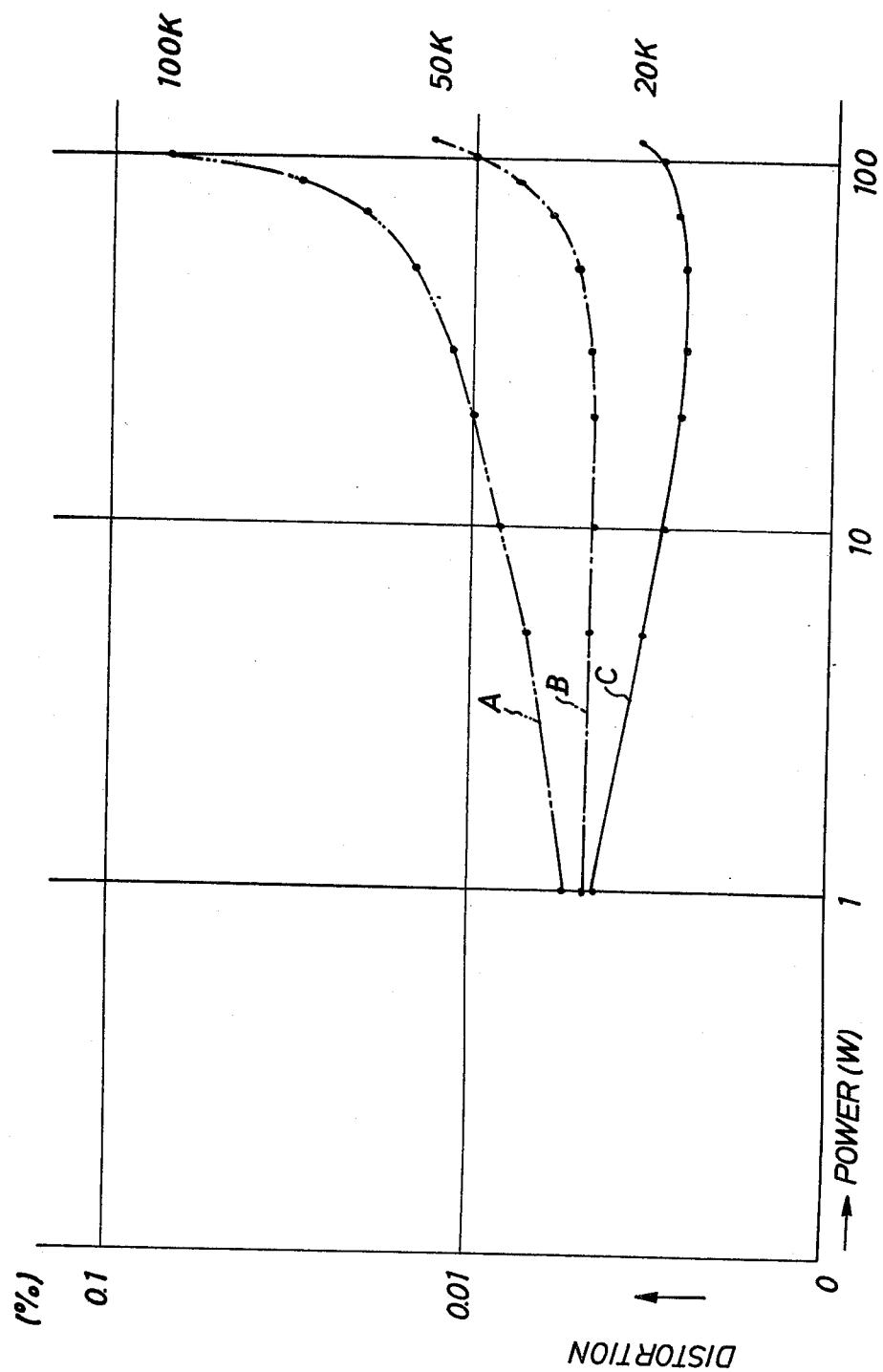
FIG. 8 is a logarithmic graph showing the distortions of output signals in the embodiment circuit shown in FIG. 5.

FIG. 7 shows the occurrence of distortions in the conventional circuits and FIG. 8 the occurrence of total distortions including switching, cross-over and other distortions in the circuit embodiment shown in FIG. 5, in which curves A, B and C represent distortions caused when frequencies are 100 KHz, 50 KHz and 20 KHz. It can be understood from these Figures that total distortions are substantially reduced in output signals, particularly remarkable in the reduction of distortions in low output, because switching and cross-over distortions can be prevented by the circuit embodiment of the present invention.

Figure 9:
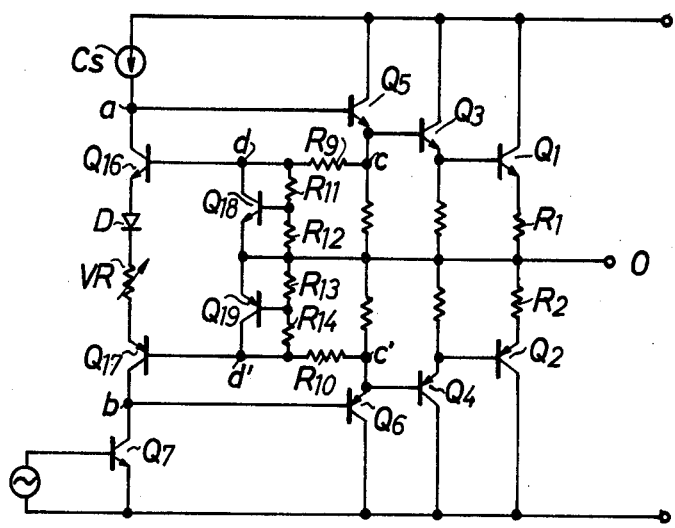
FIG. 9 is a circuit diagram showing a variation of the circuit according to the present invention.

FIG. 9 shows a variation of circuit embodiment shown in FIG. 5, in which the diode $D_5$ is replaced by an NPN transistor $Q_{18}$, a resistance $R_{11}$ inserted between its collector and base, and a resistance $R_{12}$ inserted between its base and collector. It is apparent that, when selected as a pair, resistances $R_{11}$ and $R_{12}$ serve to achieve same function as that when two diodes are connected in series. The diode $D_6$ is replaced by a PNP transistor $Q_{19}$ and resistances $R_{13}$ and $R_{14}$.

In the circuit embodiments shown in FIGS. 5 and 9, transistors are shown connected in three stages in Darlington manner, but may be connected in two, four or more stages. The base resistances $R_9$ and $R_{10}$ of transistors $Q_{16}$ and $Q_{17}$ may be connected to the emitters of transistors on any one of stages, but except for the output stages. Or the resistance $R_9$ and $R_{10}$ may be connected to the emitters of transistors on different stages of push-pull circuit.

Figure 10:
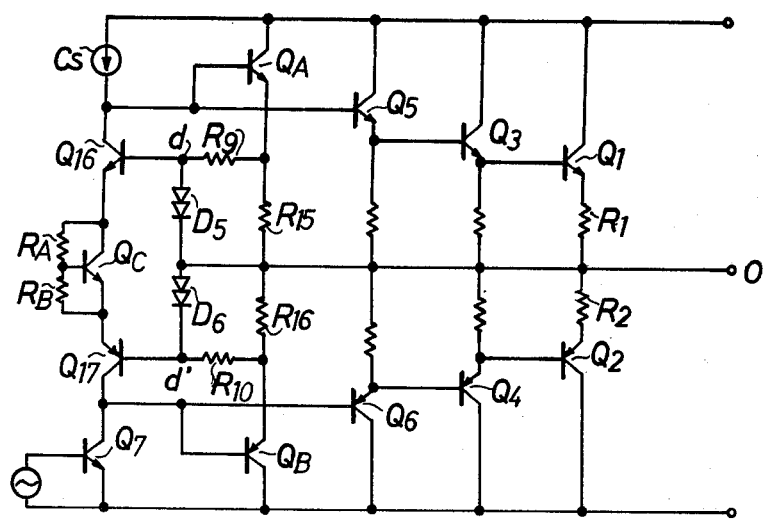
FIG. 10 is a circuit diagram showing another embodiment of the circuit according to the present invention.

FIG. 10 shows a further embodiment of the prevent invention, in which the resistances $R_9$ and $R_{10}$ are not connected to the emitters of push-pull stage transistors, but to the emitters of transistors in a different circuit comprising transistors $Q_A$, $Q_B$ and resistances $R_{15}$ and $R_{16}$. It is apparent that same operations can be attained in this case as that in the circuit embodiment shown in FIG. 5. The diodes $D_5$ and $D_6$ are also selected in this case in such a way that the potential in the point d or d' is held a voltage not exceeding the sum of $V_{BE}$ of transistors $Q_5$, $Q_3$, $Q_1$ or $Q_6$, $Q_4$, $Q_2$ following the transistors $Q_A$ and $Q_B$ connected to the resistances $R_9$ and $R_{10}$. The diode D and variable resistance VR may be replaced by a circuit comprising an NPN transistor $Q_C$, a resistance $R_A$, and a variable resistance $R_B$, as shown in FIG. 10.

FIG. 11 shows a still further embodiment of the present invention, in which the push-pull circuit is formed by two stages of transistors, with the cathode of a diode $D_A$ and the anode of a diode $D_B$ being connected to the emitters of first stage transistors $Q_3$ and $Q_4$, respectively, while with the resistances $R_9$ and $R_{10}$ being connected to the junctions between the anode of diode $D_A$ and a resistance $R_C$ and between the cathode of diode $D_B$ and a resistance $R_D$, respectively. When resistances $R_9$ and $R_{10}$ are connected in two stages in Darlington manner to the emitters of first stage transistors $Q_3$ and $Q_4$, the forward voltages of diodes $D_5$ and $D_6$ each comprising two diodes become higher than $V_{BE}$ of output transistors $Q_1$ and $Q_2$ at the time of no signal present. Therefore, the circuit embodiment shown in FIG. 11 and including the diodes $D_A$ and $D_B$ connected thereto is intended to adjust the forward voltages of diodes $D_5$ and $D_6$ comparing with the one formed equal to the sum of the forward voltages of diodes $D_A$ and $D_B$ and $V_{BE}$ of transistors $Q_1$ and $Q_2$.

Each of diodes $D_5$ and $D_6$ may be formed by a diode, but preferably by two or more diodes connected in series to give allowance for the voltage adjustment of bias circuit.

The diodes $D_5$ and $D_6$ employed in the circuit embodiments of the present invention are made of silicon semiconductor, but when made of germanium semiconductor, their diodes should be increased in number because the forward voltage of each of their diodes is 0.3 V.

Though the single drive using to the transistor $Q_7$ is shown in the above-mentioned circuits, even the so-called push-pull drive arrangement in which another drive is employed instead of constant current source CS to impress signals to the points a and b is almost same in effect.

What is claimed is:

1. A bias circuit for use in the single-ended push-pull circuit which includes NPN and PNP transistors connected in plural stages in Darlington manner, comprising a first transistor of NPN type having its collector connected to the base of a first stage NPN transistor, a second transistor of PNP type having its collector connected to the base of a first stage PNP transistor and its emitter connected to the emitter of said first transistor, a first resistance element connecting the base of said first transistor with the emitter of one of NPN transistors except that on the output stage in the push-pull circuit, a first diode connected between the base of said first transistor and the output point of said push-pull circuit, a second resistance element connecting the base of said second transistor with the emitter of one of PNP transistors except that on the output stage in the push-pull circuit, and a second diode connected between the base of said second transistor and the output point of said push-pull circuit.

2. A bias circuit according to claim 1 wherein each of said first and second diodes comprises at least two diodes connected in series.

3. A bias circuit according to claim 1 wherein a series circuit comprising a diode and a variable resistance is connected between the emitters of said first and second transistors.

4. A bias circuit for use in the single-ended push-pull circuit which includes NPN and PNP transistors connected in plural stages in Darlington manner, comprising a third NPN transistor provided on the pre-stage of said NPN transistors, a fourth PNP transistor provided on the prestage of said PNP transistors, a first transistor of NPN type having its collector connected to the base of the Darlington-connected first stage NPN transistor and to the base of said third transistor, a second transistor of PNP type having its collector connected to the base of Darlington-connected first stage PNP transistor and to the base of said fourth transistor and having its emitter connected to the emitter of said first transistor, a first resistance element connecting between the base of said first transistor and the emitter of said third transistor, a first diode connected between the base of said first transistor and the output point of said push-pull circuit, a second resistance element connected between the base of said second transistor and the emitter of said fourth transistor, and a second diode connected between the base of said second transistor and the output point of said push-pull circuit.

5. A bias circuit according to claim 4 wherein a fifth transistor is inserted between the emitters of said first and second transistors, said transistor having a variable resistance connected between the base and emitter thereof and a resistance connected between the base and collector thereof.

6. A bias circuit for use in the single-ended push-pull circuit which includes NPN and PNP transistors connected in two stages in Darlington manner, a third diode having its cathode connected to the emitter of a first stage NPN transistor, a fourth diode having its anode connected to the emitter of a first stage PNP transistor, a first transistor of NPN type having its collector connected to the base of said first stage NPN transistor, a second transistor of PNP type having its collector connected to the base of said first stage PNP transistor and its emitter connected to the emitter of said first transistor, a first resistance element connected between the base of said first transistor and the anode of said third diode, a first diode connected between the base of said first transistor and the output point of said push-pull circuit, a second resistance element connecting the base of said second transistor with the cathode of said third diode, and a second diode connected between the base of said second transistor and the output point of said push-pull circuit.

7. A bias circuit for use in a single-ended push-pull circuit which includes NPN and PNP transistors connected in plural stages in Darlington manner, comprising a first transistor of NPN type having its collector connected to the base of a first stage NPN transistor, a second transistor of PNP type having its collector connected to the base of a first stage PNP transistor and its emitter connected to the emitter of said first transistor, a first resistance element connecting the base of said first transistor with the emitter of one of NPN transistors except that on the output stage in the push-pull circuit, a first means for producing a constant voltage connected between the base of said first transistor and the output point of said push-pull circuit, a second resistance element connecting the base of said second transistor with the emitter of one of PNP transistors except that on the output stage in the push-pull circuit, and a second means for producing a constant voltage connected between the base of said second transistor and the output point of said push-pull circuit.

8. A bias circuit according to claim 7 wherein each of said first and second constant voltage means comprises a transistor and resistances respectively connected between the collector and base, and between the base and emitter of said transistor.

* * * * *